US011880300B2

(12) United States Patent
Yanes et al.

(10) Patent No.: US 11,880,300 B2
(45) Date of Patent: Jan. 23, 2024

(54) GENERATING MULTI-PLANE READS TO READ PAGES ON PLANES OF A STORAGE DIE FOR A PAGE TO READ

(71) Applicant: INTERNATIONAL BUSINESS MACHINES CORPORATION, Armonk, NY (US)

(72) Inventors: Adalberto Guillermo Yanes, Sugar Land, TX (US); Timothy J. Fisher, Cypress, TX (US); Cyril Varkey, Katy, TX (US); Kevin E. Sallese, Fushear, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 167 days.

(21) Appl. No.: 17/653,102

(22) Filed: Mar. 1, 2022

(65) Prior Publication Data

US 2023/0281119 A1    Sep. 7, 2023

(51) Int. Cl.
G06F 12/00    (2006.01)
G11C 16/00    (2006.01)
G06F 12/02    (2006.01)
G06F 3/06     (2006.01)

(52) U.S. Cl.
CPC ........ G06F 12/0253 (2013.01); G06F 3/0604 (2013.01); G06F 3/0655 (2013.01); G06F 3/0679 (2013.01); G06F 2212/7205 (2013.01)

(58) Field of Classification Search
None
See application file for complete search history.

(56) References Cited

U.S. PATENT DOCUMENTS

| 7,450,462 | B2 | 11/2008 | Lee |
| 10,170,195 | B1* | 1/2019 | Ioannou ............... G11C 29/028 |
| 10,658,054 | B2 | 5/2020 | Ioannou et al. |
| 10,770,155 | B2* | 9/2020 | Fisher ................ G11C 16/3404 |
| 2015/0205664 | A1* | 7/2015 | Janik ................... G06F 11/1012 |
| | | | 714/764 |
| 2016/0170871 | A1* | 6/2016 | Hyun .................... G06F 3/0653 |
| | | | 711/103 |
| 2017/0309338 | A1 | 10/2017 | Shah et al. |
| 2019/0043588 | A1 | 2/2019 | Fisher |

(Continued)

OTHER PUBLICATIONS

PCT International Search Report and Written Opinion dated May 31, 2023 for Application No. PCTEP2023/054861, pp. 18.

(Continued)

*Primary Examiner* — Tan T. Nguyen
(74) *Attorney, Agent, or Firm* — KONRAD RAYNES DAVDA & VICTOR LLP; David W. Victor

(57) ABSTRACT

Provided are a memory controller, system, and method for generating multi-plane reads to read pages on planes of a storage die for a page to read. A memory controller determines planes for a read to a page. A storage die of the storage dies includes a plurality of planes having a plurality of blocks and the blocks have pages. The page to read is implemented in pages on the planes. The memory controller determines threshold voltages for the pages in the determined planes and determines a derived threshold voltage from the determined threshold voltages. The derived threshold voltage is used to perform multi-plane reads of the pages from the determined planes.

20 Claims, 5 Drawing Sheets

(56) References Cited

U.S. PATENT DOCUMENTS

| | | |
|---|---|---|
| 2019/0102097 A1 | 4/2019 | Madraswala |
| 2020/0192735 A1 | 6/2020 | Ioannou |
| 2021/0241834 A1* | 8/2021 | Kim .................. G11C 16/26 |
| 2021/0264986 A1* | 8/2021 | Kim .................. G11C 29/021 |
| 2022/0044746 A1* | 2/2022 | Hsu .................. G11C 16/12 |

OTHER PUBLICATIONS

W. Choi, et al., "Parallelizing Garbage Collection with I/O to Improve Flash Resource Utilization", ACM, HPDC '18: The 27th International Symposium on High-Performance Parallel and Distributed Computing, Jun. 11-15, 2018, pp. 243-254.

R. Stoica, et al., "Enabling 3D QLC NAND flash", IBM Corporation, Flash Memory Summit, 2019, pp. 24.

O. Hambrey, "NAND Flash Basics & Error Characteristics", IBM Corporation, Flash Memory Summit, 2019, pp. 34.

"Solid State Drive Primer # 11—Controller Functions—Garbage Collection", Cactus Technologies, Jul. 6, 2015, pp. 8, [online][retrieved Feb. 21, 2022] https://www.cactus-tech.com/resources/blog/details/solid-state-drive-pri . . . .

* cited by examiner

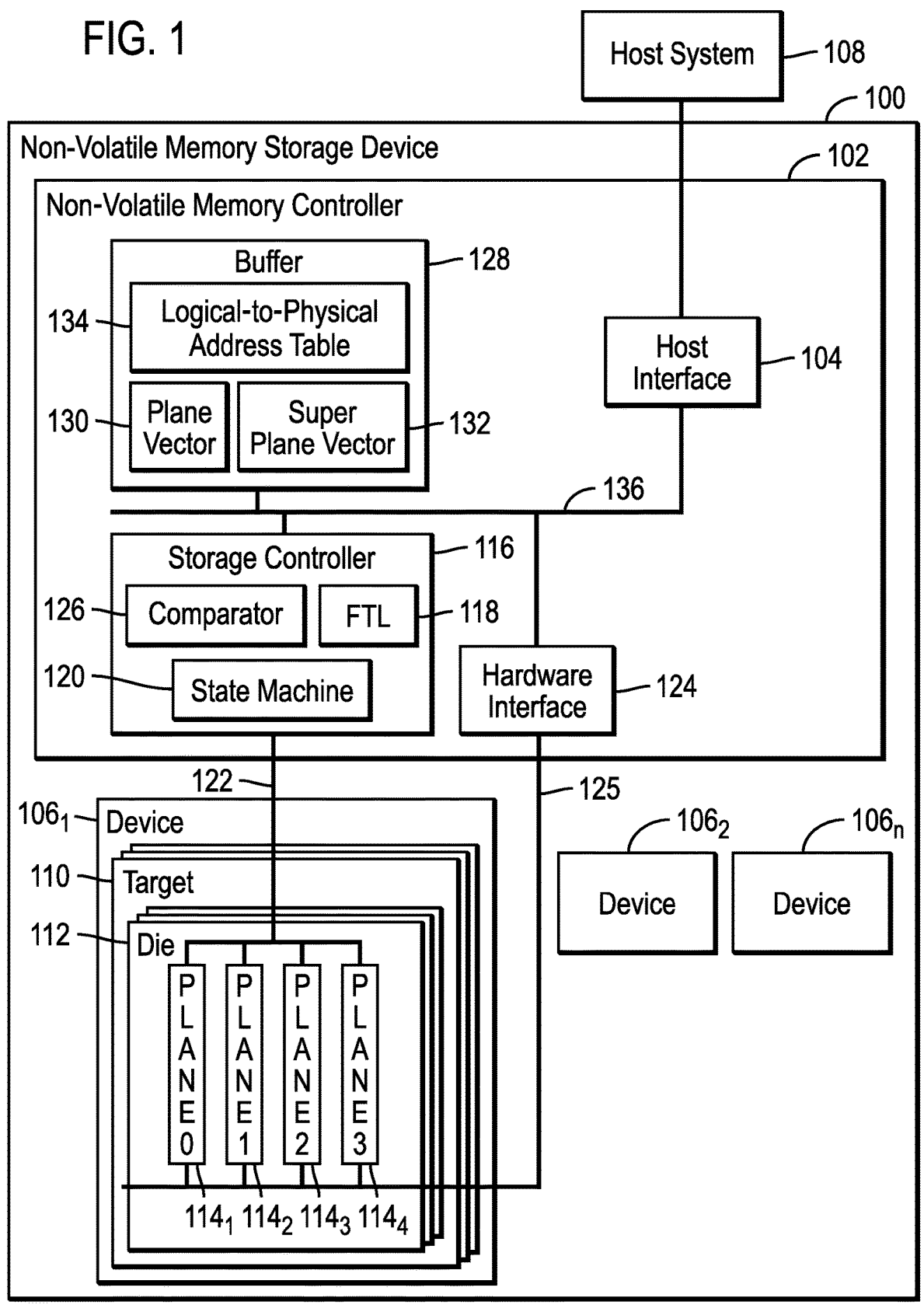

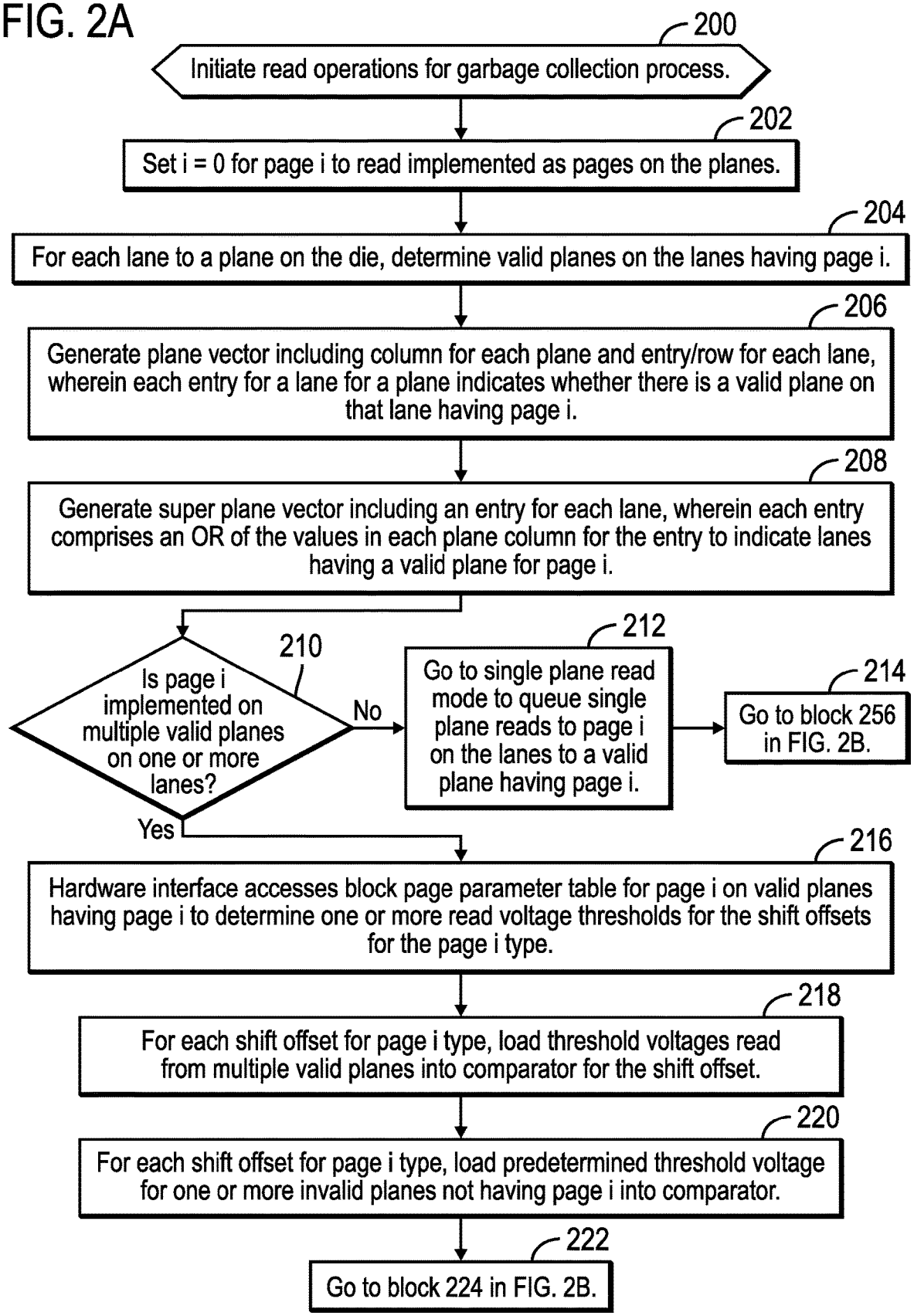

GENERATING MULTI-PLANE READS TO READ PAGES ON PLANES OF A STORAGE DIE FOR A PAGE TO READ

BACKGROUND OF THE INVENTION

1. Field of the Invention

The present invention relates to a memory controller, system, and method for generating multi-plane reads to read pages on planes of a storage die for a page to read.

2. Description of the Related Art

Solid state storage devices (for example, solid state drives or SSDs) may be comprised of one or more packages of non-volatile memory dies implementing NAND memory cells, where each die is comprised of storage cells. Storage cells are organized into pages and pages are organized in blocks, and the blocks are stored in planes of a storage die.

In NAND flash memory devices, pages cannot be updated without the entire block of pages being erased and the data written to a new location. To free up blocks of pages, the pages having valid data being used on a block need to be consolidated and written to a new block to fill up all the pages on that new block, and the blocks previously storing the dispersed pages may then be erased to make available for new data.

There is a need in the art for improved techniques for reading data from planes on a storage die as part of a garbage collection or other process.

SUMMARY

Provided are a memory controller, system, and method for generating multi-plane reads to read pages on planes of a storage die for a page to read. A memory controller determines planes for a read to a page. A storage die of the storage dies includes a plurality of planes having a plurality of blocks and the blocks have pages. The page to read is implemented in pages on the planes. The memory controller determines threshold voltages for the pages in the determined planes and determines a derived threshold voltage from the determined threshold voltages. The derived threshold voltage is used to perform multi-plane reads of the pages from the determined planes.

BRIEF DESCRIPTION OF THE DRAWINGS

FIG. 1 illustrates an embodiment of a non-volatile memory storage device.

FIGS. 2A and 2B illustrates an embodiment of operations performed by a storage controller to generate and queue multi-plane reads to read pages from planes of a storage die as part of a garbage collection or other processes.

DETAILED DESCRIPTION

Figure 2B:
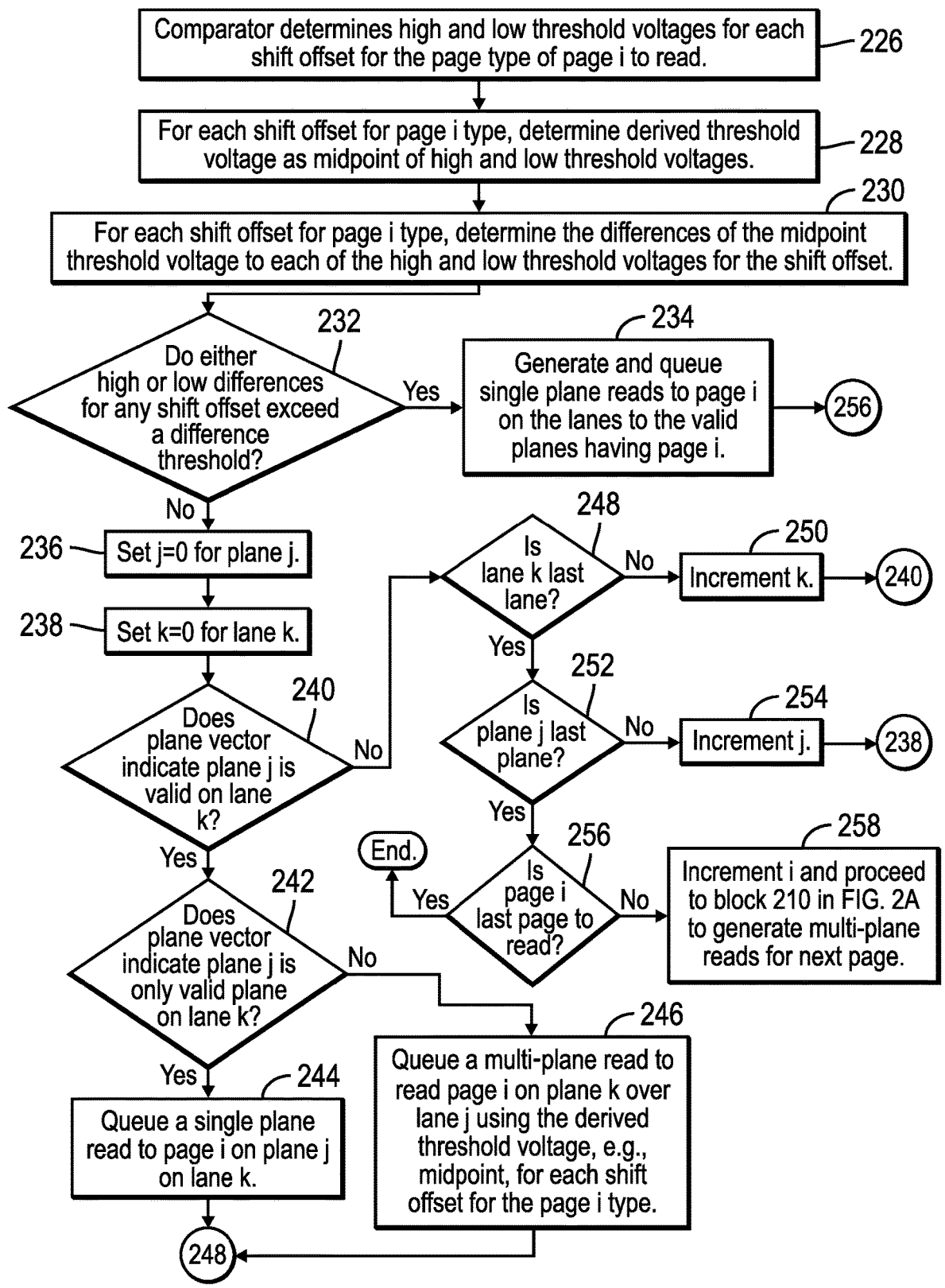

One technique to improve programming bandwidth of NAND flash memory divided into planes of pages is through multi-plane operations, such as multi-plane reads. In a multi-plane read, data is read sequentially for each of the memory planes. The program time to read multiple pages for multiple planes using a multi-plane read is equivalent to a time to read one page of memory. Described embodiments provide improved techniques for generating multi-plane reads to read pages from planes on a storage die that generates multi-plane reads for the lanes to a plane having the page to read without having to determine a programmable start lane. This allows the multi-plane reads to be generated efficiently by using the lowest valid physical lane as the start lane.

Described embodiments further improve the process of generating multi-plane reads to read a page by determining the threshold voltages for shift offsets for a page once for all of the multi-plane reads for a page. Further, the gathering of the threshold voltage information is optimized because this information is not gathered if multi-plane reads cannot be used when the pages are not stored on multiple planes on the lanes.

Further, described embodiments provide improved techniques for determining common derived threshold voltages for a page type to use for multi-plane reads to the planes having the page of the page type. If the determined derived threshold voltages to use for the multi-plane reads do not satisfy certain constraints with respect to the high and low threshold voltages provided for the page type on the planes, then a decision is made to use single plane reads instead of multi-plane reads to avoid using derived threshold voltages that sufficiently deviate from the high and low threshold voltages for the page type of the pages to read on the planes.

FIG. 1 illustrates an embodiment of a non-volatile memory storage device 100 having a non-volatile memory controller 102, including a host interface 104 to transfer blocks of data and I/O commands between a plurality of groups of devices $106_1, 106_2 \ldots 106_n$, such as NAND chips, and a host system 108. Each device $106_1, 106_2 \ldots 106_n$, may include, as shown with respect to device $106_1$, a plurality of targets 110, where each target 110 has one or more dies 110. Each die 112 may be organized as a plurality of planes $114_0, 114_1, 114_2, 114_3$. In the exemplar embodiment of FIG. 1, there are four planes per die 112. Each plane $114_i$ includes a plurality of blocks, where each block comprises a plurality of pages of storage cells. In NAND implementations, the cells forming the pages may comprise floating gates transistors, where cells within a block are connected in a grid connected via a bitline via source/drains and a wordline connects via control gates. All cells in a wordline are programmed/read simultaneously and all cells in the block are erased simultaneously.

The non-volatile memory controller 102 includes one or more storage controllers 116 to perform read and write operations with respect to the pages in the planes $114_0, 114_1, 114_2, 114_3$ of a die 112. The storage controller 116, such as a flash memory controller, includes a flash translation layer (FTL) 118 to manage mapping between logical and physical addresses in pages implemented in the planes $114_0, 114_1, 114_2, 114_3$. A state machine 120 includes firmware/hardware logic to generate reads and writes to the cells in the planes. The state machine 120 may generate single plane reads directed to a page in a single plane $114_i$ or multi-plane reads which are read requests to be sent to pages in multiple planes $114_0, 114_1, 114_2, 114_3$. The storage controller 116 includes a plurality of separate lanes 122 to each of the planes $114_0, 114_1, 114_2, 114_3$ in a die 112, such as twenty separate lanes to each plane $114_0, 114_1, 114_2, 114_3$ in a die. The devices $106_2 \ldots 106_n$ may have the same structure and lines 122 shown with respect to device $106_1$.

A hardware interface 124 may be used to independently read a block page parameter (BPT) table from each page in plane $114_0$, $114_1$, $114_2$, $114_3$ via connections 125 to determine the read threshold voltages for the one or more shift offsets in a page to read during garbage collection. The number of threshold voltages for shift offsets depends on the type of page being read. For instance, for a quad level cell (QLC), where there are 4 bit layers per cell, a top page may have five threshold voltages for shift offsets S0, S1, S2, S3, and S4, a lower page and upper page may have just one threshold voltage for shift offset S0, and an extra page may have three threshold voltages for shift offsets S0, S1, and S2. Thus, depending on the page type, there may be one or more read threshold voltages for different shift offsets. There may also be different number of shift offsets for different cell levels, e.g., Single Level Cell (SLC), Multiple Level Cell (MLC), Tri Level Cell (TLC), or other level cell level numbers.

For a multi-plane read, the state machine 120 determines one common threshold voltage for each shift offset, depending on the page type, to use to perform a multi-plane read to all the pages of the page type in the plane. The storage controller 116 may include a comparator 126 into which the threshold voltages, as determined by the hardware interface 124, for all the planes $114_0$, $114_1$, $114_2$, $114_3$ to read, are loaded. In described embodiments, one comparator 126 is used for all the shift offsets for hardware efficiency. In an alternative embodiment, there may be a separate comparator 126 for each shift offset of threshold voltages from the planes. The comparator 126 may then perform pairwise comparisons of each pair of threshold voltages for a shift offset to determine a high and low threshold voltages for the shift offset. This comparison would be performed for the threshold voltages for each shift page offset the hardware interface 124 reads from the block page parameter table for each page in a valid plane $114_0$, $114_1$, $114_2$, $114_3$ to read. The state machine 120 may then determine a common threshold voltage to use for a shift offset, e.g., S0, S1, S2, S3, S4, by finding the midpoint of the high and low threshold voltages. This common threshold voltage calculated for each shift offset may then be used to perform the multi-plane read to the pages of the page type on the planes $114_0$, $114_1$, $114_2$, $114_3$.

The non-volatile memory controller 102 may further include a buffer 128, such as a Dynamic Random Access Memory (DRAM) or other volatile or non-volatile memory device, to store information generated and used by the storage controller 116 during read, write and garbage collection operations.

When preparing to read a page for garbage collection, the state machine 120 may generate in the buffer 128 a plane vector 130 comprising a matrix having a column for each plane $114_0$, $114_1$, $114_2$, $114_3$ to read and an entry/row for each lane 122 to the plane. The value in each entry would indicate whether there is a valid plane on the lane represented by the entry, where a "1" may indicate a valid plane and "0" indicate no valid plane. The state machine 120 may further generate a super plane vector 132 in the buffer 128 having a single column, where each entry comprises an OR of all the entries in a row across all the columns, i.e., an OR of the values for all planes for one lane. A value of "1" in an entry of the super plane vector 132 indicates there is at least one valid plane $114_0$, $114_1$, $114_2$, $114_3$ on the lane identified by the entry and a "0" indicates no valid plane on the lane identified by the entry.

The buffer 128 may further store a logical-to-physical address table 134 providing a mapping of logical addresses to which I/O requests are directed and physical addresses in the devices $106_1$, $106_2 \ldots 106_n$ at which the data for the logical addresses are stored. The logical addresses may comprise logical block address (LBAs) or other logical addresses known in the art. The FTL 118 uses the logical-to-physical address table 134 to determine physical locations in the devices at which data is to be stored.

This architecture of the storage controller 116 and hardware interface 124 may be repeated for different dies, targets, and devices.

The non-volatile memory storage device 100 may function as both a memory device and/or a storage device (for example, a Solid State Drive (SSD)) in a computing system, and may be used to perform the role of volatile memory devices and non-volatile storage media in a computing system. In an embodiment, the non-volatile memory storage device 100 may comprise a non-volatile memory storage device.

In one embodiment, the storage device 100 may comprise a block addressable memory device, such as those based on NAND or NOR technologies. The memory device may use a two-dimensional or three-dimensional NAND array. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

The host interface 104 connects the non-volatile memory storage device 100 to a host system 108. The non-volatile memory storage device 100 may be installed or embedded within the host system 108, such as shown and described with respect to element 408 or 410 in FIG. 4, or the non-volatile memory storage device 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

The host interface 104, buffer 128, one or more hardware interfaces 124, and one or more storage controllers 116 may communicate over one or more bus interfaces 136, such as a PCIe or other type of bus or interface. In alternative embodiments the connection among any of the components 104, 116, 124, 126 may comprise direct lines or paths and not a shared bus.

A garbage collection process is used with NAND flash memory devices to consolidate valid data written to pages in the memory device to a new page because flash memory is erased before it can be rewritten. Rewriting data in the flash memory requires pages of data to be read, updated, and written to a new location because data cannot be rewritten in place. The page having the source of the data copied to the new location may then be erased and reused.

FIGS. 2A and 2B illustrate an embodiment of operations performed by the storage controller 116, including a comparator 126 and a state machine 120, to perform multi-plane reads of pages from the devices $106_1$, $106_2$ ... $106_n$ as part of a garbage collection or other operation. Upon initiating (at block 200) read operations for a garbage collection or other process to read pages, the storage controller 116 sets (at block 202) the variable i to zero for page i implemented as pages on the planes $114_0$, $114_1$, $114_2$, $114_3$. A determination is made (at block 204), for each lane 122 to a plane on the die 112, of valid planes $114_0$, $114_1$, $114_2$, $114_3$ on the lanes having page i to read. In certain embodiments, there may be four planes $114_0$, $114_1$, $114_2$, $114_3$ on a die 112 and 20 lanes 122 to each plane $114_0$, $114_1$, $114_2$, $114_3$. In alternative embodiments, there may be a different number of planes on each die 112. The storage controller 116, such as the state machine 120, may generate (at block 206) a plane vector 130 comprising a matrix including a column for each plane $114_0$, $114_1$, $114_2$, $114_3$ and entry/row for each lane, wherein each entry for a lane and a plane indicates whether there is a valid plane, represented by the column, on that lane, represented by the row, for the page i to read. A super plane vector 132 is generated (at block 208) comprising a single column vector including an entry for each lane. Each entry in the super plane vector 132 comprises an OR of the values in each plane column of the plane vector 130 for the entry/row to indicate whether that lane has at least one valid plane, e.g., a "1", or no valid planes, e.g., a "0".

If (at block 210) the plane vector 130 indicates page i is not implemented on multiple valid planes on one or more lanes, i.e., is implemented on only one plane (only one plane in the plane vector 130 is indicated as having a valid plane on each lane), then the state machine 120 switches to single plane read mode to generate and queue (at block 212) single plane reads to page i on the lanes 122 to a valid plane having page i. Control then proceeds (at block 214) to block 256 in FIG. 2B to consider a next page to read. In a further embodiment, the super plane vector 132 may first be considered to determine if any lane has a valid plane for the page and, if so, control proceeds to block 210 to consider the plane vector 130. If there is no valid plane for the lanes to the page i, then control may proceed to process a next page.

If (at block 210) the plane vector 130 indicates page i is implemented on multiple valid planes $114_0$, $114_1$, $114_2$, $114_3$ on the lanes 122, then the state machine 120 interacts (at block 216) with the hardware interface 124 to access the block page parameter table (BPT) for page i on all valid planes $114_0$, $114_1$, $114_2$, $114_3$ to determine one or more read voltage thresholds, for one or more shift offsets for page i type, on page i on each valid plane $114_0$, $114_1$, $114_2$, $114_3$. The state machine 120 loads (at block 218), for each shift offset for page i type, the threshold voltages read from page i on the valid planes $114_0$, $114_1$, $114_2$, $114_3$ into the comparator 126. There may be one comparator 126 for each shift offset for page i type. Thus, if there are threshold voltages for shift offsets S0, S1, S2 read from page i on four valid planes, then there would be 12 threshold voltages loaded into the comparator 126. For each shift offset for page i type, the state machine 120 loads (at block 220) a predetermined threshold voltage for one or more invalid planes into the comparator 126, so that the comparator 126 includes threshold voltages to compare for all planes and shift offsets. An invalid plane comprises a plane that does not provide the page i being read on the lane being considered. Control then proceeds (at block 222) to block 224 in FIG. 2B.

The loaded comparator 126 determines (at block 226), from the loaded threshold voltages, the high and low threshold voltages for each shift offset for the page type of page i to read. The comparator 126 may perform pairwise comparisons of each pair of threshold voltages for a shift offset to determine the high and low threshold voltages for the shift offset. The state machine 120 may then determine (at block 228), for each shift offset, a derived threshold voltage as a midpoint of the high and low threshold voltages determined by the comparator 126 for the shift offset, e.g., S0, S1, S2, S3. Derivations and calculations other than a midpoint may be used to determine a derived or common threshold voltage to use for a multi-plane read to all valid planes on a lane. After generating the derived threshold voltages to use for a multi-plane reads for the shift offsets for the page i type, a determination may be made whether the derived threshold voltages falls within an acceptable range of the high low threshold voltages for a shift offset.

To verify the derived threshold voltages, for each shift offset for page i type, the state machine 120 determines (at block 230) the differences of the midpoint derived threshold voltage to each of the high and low threshold voltages for the shift offset. If (at block 232) the high or low differences for any shift offset for the page i type exceeds one or more difference thresholds, indicating the derived threshold voltages deviate too far from the high and low thresholds, then the state machine 120 generates and queues (at block 234) singe plane reads to page i on the lanes 122 to the valid planes $114_0$, $114_1$, $114_2$, $114_3$ having page i. Control then proceeds to block 256 in FIG. 2B to consider the next page to read. There may be different difference thresholds for the high and low differences and for different shift offsets, or there maybe one or more common difference thresholds.

If (at block 232) the high or low differences for all the shift offsets do not exceed a difference threshold, indicating the derived threshold voltages are within an acceptable deviation, then the variable j is set (at block 236) to zero for plane j and the variable k is set (at block 238) to zero for lane k of the lanes 122. If (at block 240) the plane vector 130 indicates that plane j is valid on lane k and if (at block 242) the plane vector 130 indicates plane j is only valid plane on lane k, then the state machine 120 queues (at block 244) a single plane read to page i on plane j on lane k. If (at block 242) the plane vector 130 indicates plane j is not the only valid plane on lane k, then the state machine 120 generates (at block 246) a multi-plane read to read page i on plane j on lane k using the derived threshold voltage, e.g., midpoint, for each shift offset for the page i type. This multi-plane read may be queued for later processing when all the multi-plane reads are received for a page on a lane. From the no branch of block 240, block 244 or block 246 control proceeds to block 248 to process the next lane for page i.

If (at block 248) lane k is not the last lane 122, then k is incremented (at block 250) and control proceeds to block 240 to consider whether to issue a multi-plane read on the next lane k for plane j. If (at block 248) plane k is the last lane and if (at block 252) plane j is not the last plane $114_3$, then j is incremented (at block 254) and control proceeds to block 238 to generate multi-plane reads for the next plane $114_p$. If (at block 252) plane j is the last plane $114_3$ and if (at block 256) page i is not the last page to read, then i is incremented (at block 258) and control proceeds to block 210 in FIG. 2A to generate multi-plane reads for the next page to read. If (at block 256) page i is the last page to read, then control ends.

With the embodiment of operations of FIGS. 2A and 2B, the state machine 120 accesses the shift offset threshold voltages for pages in a multi-plane read using the hardware interface 124 to use to calculate common derived threshold voltage for each page offset for the page type upon determining that multi-plane reads will be performed. In this way, the page offset threshold voltages are determined via a hardware interface 124 before generating the multi-plane reads. Further, with described embodiments, for each page to read, each plane and all lanes to the plane are processed to determine whether to issue multi-pane reads if there are multiple planes on a lane providing a page for the page to read. If there are not multiple planes on a lane, then a single plane read is issued for that lane and control proceeds to consider the next lane for a plane and page. The described embodiments provide improved efficiency for maximizing the number of multi-plane reads that can be issued to read a page on multiple planes because multi-plane reads are generally more efficient than single plane reads.

Figure 3:
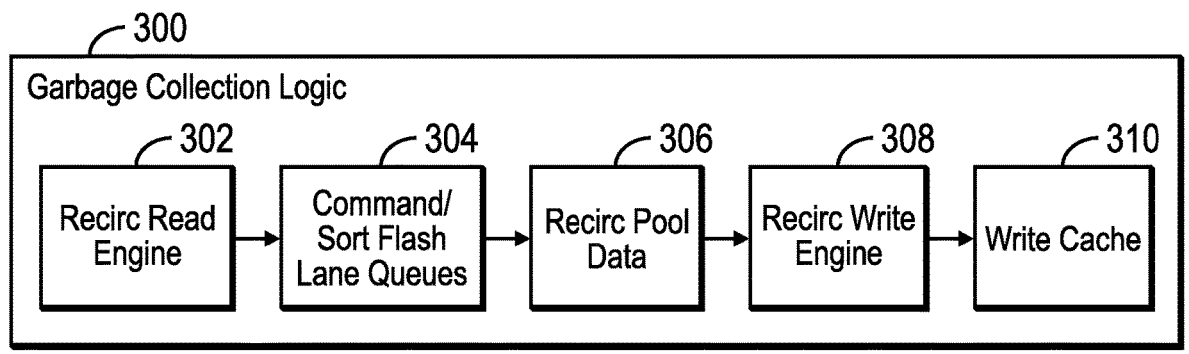
FIG. 3 illustrates an embodiment of garbage collection logic to implement the operations of FIGS. 2A and 2B to generate and queue multi-plane reads as part of a garbage collection process to rewrite valid data in a memory storage device to consolidate at new locations.

FIG. 3 illustrates an implementation of logic components comprised of circuitry and/or firmware to implement a garbage collection unit 300 in the storage controller 116. A recirc (recirculation) read engine 302 may implement the logic of FIGS. 2A and 2B to generate multi-plane reads or single plane reads for each page and for each lane to each of the planes having a page for the page to read. The recirc read engine 302 stores each generated multi-plane read or single plane read in a lane queue 304. When all the multi-plane reads are received for a lane and a page, the lane queue for that lane sends the multi-plane reads or single plane read to the storage die 112 having the planes $114_0$, $114_1$, $114_2$, $114_3$ to read. When issuing the multi-plane reads, the state machine 120 may set a flag informing the lane queue 304 that the read is a multi-plane read and set a count indicating a number of planes for which multi-plane reads will be generated for the lane k and page i. The lane queue 304 would wait until all multi-plane reads are received for lane k and page i and upon receipt of the full count of planes, send all the queued multi-plane reads to the storage die 112 to read the page i from the valid planes $114_0$, $114_1$, $114_2$, $114_3$ on lane k.

Upon reading the pages on the different planes for a lane, the read pages are stored in a recirc pool data 306. A recirc write engine 308 generates write requests to write all the read pages in the recirc pool data 306 in a write cache 310. The write requests added to the write cache 310 are then transmitted to write the read data to new storage locations on the storage dies as part of a garbage collection process.

Figure 4:
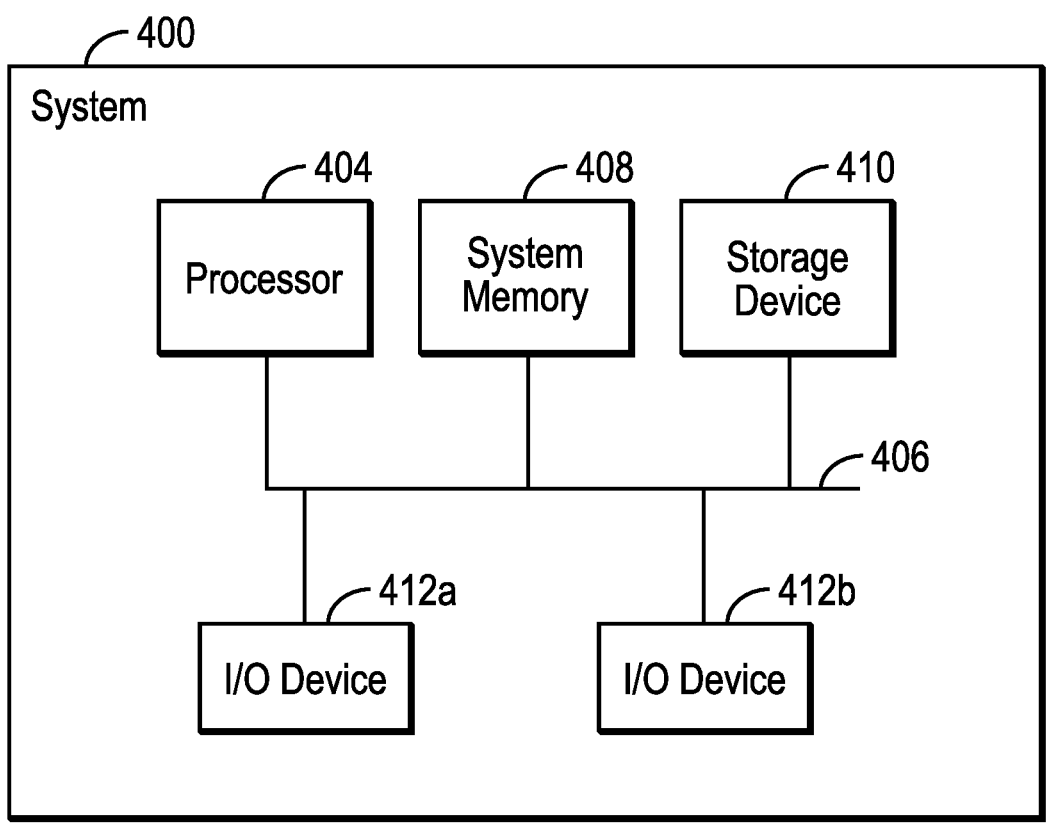
FIG. 4 depicts a computing environment in which the components of FIG. 1 may be implemented.

FIG. 4 illustrates an embodiment of a system 400 in which the non-volatile memory storage device 100 of FIG. 1 may be deployed as the system memory device 408 and/or a storage device 410. The system 400 includes a processor 404 that communicates over a bus 406 with a system memory device 408 in which programs, operands and parameters being executed by the processor 404 are cached, and a storage device 410, which may comprise a solid state drive (SSD) that stores programs, operands, parameters, and user data that may be loaded into the system memory 408 for execution by the processor 404. The processor 404 may also communicate with Input/Output (I/O) devices 412a, 412b, which may comprise input devices (e.g., keyboard, touchscreen, mouse, etc.), display devices, graphics cards, ports, network interfaces, etc. The memory 408 and storage device 410 may be coupled to an interface on the system 400 motherboard, mounted on the system 400 motherboard, or deployed in an external memory device or accessible over a network.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The letter designators, such as i, j, k, p, n, among others, used to designate a number of instances of an element may indicate a variable number of instances of that element when used with the same or different elements.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A memory controller coupled to a plurality of storage dies having pages of data, wherein the memory controller implements logic to perform operations with respect to the storage dies, the operations comprising:
   determining planes for a read to a page, wherein a storage die of the storage dies includes a plurality of planes having a plurality of blocks, wherein the blocks have pages, wherein the page to read is implemented in pages on the planes;
   determining threshold voltages for the pages in the determined planes;
   determining a derived threshold voltage from the determined threshold voltages; and
   using the derived threshold voltage to perform multi-plane reads of the pages from the determined planes.

2. The memory controller of claim 1, wherein the derived threshold voltage is used to read the pages from the determined planes as part of a garbage collection operation to read the pages from the determined planes to write valid data from the read pages to pages in a different location in the storage dies.

3. The memory controller of claim 1, wherein the memory controller is coupled to the planes on the storage die through a plurality of lanes, wherein the planes are read by issuing multi-plane reads through one of the lanes, wherein the operations further comprise performing for each lane number of the lanes to the planes:
   determining valid planes accessible through the lanes having the lane number, wherein the determined planes read by the multi-plane reads comprise the determined valid planes.

4. The memory controller of claim 3, wherein the operations further comprise:
   maintaining a plane vector for each of the planes including a value for each of the lanes to a plane indicating whether the plane is valid for each of the lanes;
   maintaining a super plane vector including a value for each of the lanes comprising an OR of the values for the planes for each of the lanes indicating which lanes have at least one valid plane,
   wherein the determining the valid planes for each lane comprises:
      determining whether the super plane vector indicates there is at least one valid plane for the lane; and
      processing the plane vectors to determine the valid planes for the lane in response to determining that the super plane vector indicates there is at least one valid plane for the lane, wherein a multi-plane read is directed to the page to read to each valid plane indicated in the plane vectors for a lane indicated in the super plane vector as having a valid plane on that lane.

5. The memory controller of claim 3, wherein the determining the threshold voltages and the determining the derived threshold voltage are performed for the page to read and used for the multi-plane reads to the page on the lanes to the planes, wherein the determining the threshold voltages comprises determining the threshold voltages for the pages to read on the determined valid planes and wherein the determining the derived threshold voltage is determined from the threshold voltages read for the pages on the determined valid planes to read.

6. The memory controller of claim 1, wherein the determining the threshold voltages for the pages to read in the determined planes comprises determining a high threshold voltage and a low threshold voltage for a page type of the pages to read in the determined planes, wherein the operations further comprise:
   determining whether differences between the derived threshold voltage and the high threshold voltage and the derived threshold voltage and the low threshold voltage exceed at least one difference threshold; and
   generating single plane reads to the pages from the determined planes in response to at least one of the differences of the derived threshold voltage and the high and the low threshold voltages exceeding the at least one difference threshold, wherein the using the derived threshold voltage for the multi-plane reads is performed in response to determining that the differences of the derived threshold voltage and the high and the low threshold voltages does not exceed the at least one difference threshold.

7. The memory controller of claim 6, wherein the derived threshold voltage comprises a midpoint between the high and the low threshold voltages for the pages in the determined planes.

8. The memory controller of claim 1, wherein the determining the threshold voltages for the pages in the determined planes comprises:
   determining a page type of the pages to read in the planes, wherein different page types provide a different number of threshold voltages for different shift offsets;
   determining threshold voltages from the pages to read in the planes for the different shift offsets; and
   for each threshold voltage provided for a shift offset for the page type of the pages to read, determining a derived threshold voltage from the threshold voltages for the shift offset, wherein at least one derived threshold voltage for at least one shift offset used to read the pages in the planes is used for the multi-plane reads of the pages in the planes.

9. The memory controller of claim 8, wherein the determining the derived threshold voltage from the threshold voltages for each shift offset is performed by a comparator pairwise comparing each pair of the threshold voltages to determine a high threshold voltage and a low threshold voltage for the shift offset to use to determine the derived threshold voltage for each shift offset.

10. The memory controller of claim 1, wherein if at least one plane of the planes to read is an invalid plane, determining the threshold voltages for valid planes and using a predefined threshold for at least one invalid plane to determine the derived threshold voltage.

11. A system, comprising:
   a storage device comprising:
      a plurality of storage dies having pages of data; and
      a memory controller coupled to the storage dies, wherein the memory controller implements logic to perform operations with respect to the storage dies, the operations comprising:
         determining planes for a read to a page, wherein a storage die of the storage dies includes a plurality of planes having a plurality of blocks, wherein the blocks have pages, wherein the page to read is implemented in pages on the planes;
         determining threshold voltages for the pages in the determined planes;
         determining a derived threshold voltage from the determined threshold voltages; and using the derived threshold voltage to perform multi-plane reads of the pages from the determined planes.

12. The system of claim 11, wherein the memory controller is coupled to the planes on the storage die through a plurality of lanes, wherein the planes are read by issuing multi-plane reads through one of the lanes, wherein the operations further comprise performing for each lane number of the lanes to the planes:
   determining valid planes accessible through the lanes having the lane number, wherein the determined planes read by the multi-plane reads comprise the determined valid planes.

13. The system of claim 11, wherein the determining the threshold voltages for the pages to read in the determined planes comprises determining a high threshold voltage and a low threshold voltage for a page type of the pages to read in the determined planes, wherein the operations further comprise:
   determining whether differences between the derived threshold voltage and the high threshold voltage and the derived threshold voltage and the low threshold voltage exceed at least one difference threshold; and
   generating single plane reads to the pages from the determined planes in response to at least one of the differences of the derived threshold voltage and the high and the low threshold voltages exceeding the at least one difference threshold, wherein the using the derived threshold voltage for the multi-plane reads is performed in response to determining that the differences of the derived threshold voltage and the high and the low threshold voltages does not exceed the at least one difference threshold.

14. The system of claim 11, wherein the determining the threshold voltages for the pages in the determined planes comprises:
   determining a page type of the pages to read in the planes, wherein different page types provide a different number of threshold voltages for different shift offsets;
   determining threshold voltages from the pages to read in the planes for the different shift offsets; and
   for each threshold voltage provided for a shift offset for the page type of the pages to read, determining a derived threshold voltage from the threshold voltages for the shift offset, wherein at least one derived threshold voltage for at least one shift offset used to read the pages in the planes is used for the multi-plane reads of the pages in the planes.

15. The system of claim 14, wherein the memory controller includes a comparator, wherein the determining the derived threshold voltage from the threshold voltages for each shift offset is performed by the comparator pairwise comparing each pair of the threshold voltages to determine a high threshold voltage and a low threshold voltage for the shift offset to use to determine the derived threshold voltage for each shift offset.

16. The system of claim 11, further comprising:
   a processor; and
   a system memory, wherein program code and user data are loaded from the storage device to the system memory for processing by the processor.

17. A method implemented in a memory controller for performing multi-plane reads to a plurality of storage dies having pages of data, comprising:
   determining planes for a read to a page, wherein a storage die of the storage dies includes a plurality of planes having a plurality of blocks, wherein the blocks have pages, wherein the page to read is implemented in pages on the planes;
   determining threshold voltages for the pages in the determined planes;
   determining a derived threshold voltage from the determined threshold voltages; and
   using the derived threshold voltage to perform multi-plane reads of the pages from the determined planes.

18. The method of claim 17, wherein the memory controller is coupled to the planes on the storage die through a plurality of lanes, wherein the planes are read by issuing multi-plane reads through one of the lanes, further comprising:
   performing for each lane number of the lanes to the planes:
      determining valid planes accessible through the lanes having the lane number, wherein the determined planes read by the multi-plane reads comprise the determined valid planes.

19. The method of claim 17, wherein the determining the threshold voltages for the pages to read in the determined planes comprises determining a high threshold voltage and a low threshold voltage for a page type of the pages to read in the determined planes, further comprising:
   determining whether differences between the derived threshold voltage and the high threshold voltage and the derived threshold voltage and the low threshold voltage exceed at least one difference threshold; and
   generating single plane reads to the pages from the determined planes in response to at least one of the differences of the derived threshold voltage and the high and the low threshold voltages exceeding the at least one difference threshold, wherein the using the derived threshold voltage for the multi-plane reads is performed in response to determining that the differences of the derived threshold voltage and the high and the low threshold voltages does not exceed the at least one difference threshold.

20. The method of claim 17, wherein the determining the threshold voltages for the pages in the determined planes comprises:
   determining a page type of the pages to read in the planes, wherein different page types provide a different number of threshold voltages for different shift offsets;
   determining threshold voltages from the pages to read in the planes for the different shift offsets; and
   for each threshold voltage provided for a shift offset for the page type of the pages to read, determining a derived threshold voltage from the threshold voltages for the shift offset, wherein at least one derived threshold voltage for at least one shift offset used to read the pages in the planes is used for the multi-plane reads of the pages in the planes.

* * * * *